United States Patent
Shin et al.

(10) Patent No.: US 9,818,811 B2
(45) Date of Patent: Nov. 14, 2017

(54) ORGANIC LIGHT EMITTING DISPLAY DEVICES AND METHODS OF MANUFACTURING ORGANIC LIGHT EMITTING DISPLAY DEVICES

(71) Applicant: Samsung Display Co., Ltd., Yongin, Gyeonggi-Do (KR)

(72) Inventors: Hyea-Weon Shin, Yongin (KR); Dong-Won Lee, Yongin (KR); Young-Mok Son, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/754,654

(22) Filed: Jun. 29, 2015

(65) Prior Publication Data
US 2015/0303243 A1    Oct. 22, 2015

Related U.S. Application Data

(62) Division of application No. 13/919,343, filed on Jun. 17, 2013, now abandoned.

(30) Foreign Application Priority Data

Sep. 28, 2012  (KR) .......................... 10-2012-0108682

(51) Int. Cl.
*H01L 27/32*  (2006.01)
*H01L 51/52*  (2006.01)
(Continued)

(52) U.S. Cl.
CPC ...... *H01L 27/3258* (2013.01); *H01L 27/3246* (2013.01); *H01L 51/0004* (2013.01);
(Continued)

(58) Field of Classification Search
CPC ............ H01L 27/3258; H01L 51/5056; H01L 51/5012; H01L 51/5092; H01L 51/5072;
(Continued)

(56) References Cited

U.S. PATENT DOCUMENTS 7,656,084 B2    2/2010 Ishida
7,777,411 B2    8/2010 Seki
(Continued)

FOREIGN PATENT DOCUMENTS

CN             1689377       10/2005
CN            101326452       9/2011
(Continued)

OTHER PUBLICATIONS

Taiwanese Office Action issued by Taiwan Intellectual Property Office dated Aug. 12, 2016 in corresponding Taiwanese Patent Application No. 102125848 which also claims Korean Patent Application No. 10-2012-0108682 as its priority application, together with Request for Entry of the Accompanying Office Action attached herewith.

(Continued)

*Primary Examiner* — Michael Carter
*Assistant Examiner* — Mohammed R Alam
(74) *Attorney, Agent, or Firm* — H.C. Park & Associates, PLC

(57) ABSTRACT

An organic light emitting display device is disclosed. The organic light emitting display device includes a substrate, a first electrode, a pixel defining layer, a first hydrophobic pattern, at least one charge transport layer, a second hydrophobic pattern, an organic light emitting layer and a second electrode. The substrate has a pixel region and a non pixel region surrounding the pixel region. The first electrode, the at least one charge transport layer and the organic light emitting layer are disposed on the substrate in the pixel (Continued)

region, while the pixel defining layer, the first hydrophobic pattern and the second hydrophobic pattern are disposed on the substrate in the non pixel region. The charge transport layer of one pixel is separated from a charge transport layer of another pixel by the first and second hydrophobic patterns to prevent crosstalk phenomenon.

10 Claims, 8 Drawing Sheets

(51) Int. Cl.
  *H01L 51/56* (2006.01)
  *H01L 51/00* (2006.01)
  *H01L 51/50* (2006.01)

(52) U.S. Cl.
  CPC ...... *H01L 51/5012* (2013.01); *H01L 51/5056* (2013.01); *H01L 51/5072* (2013.01); *H01L 51/5088* (2013.01); *H01L 51/5092* (2013.01); *H01L 51/5203* (2013.01); *H01L 51/56* (2013.01); *H01L 51/5281* (2013.01)

(58) Field of Classification Search
  CPC ............. H01L 51/5088; H01L 27/3246; H01L 51/0004; H01L 51/56; H01L 51/5203; H01L 51/5281
  See application file for complete search history.

(56) References Cited

U.S. PATENT DOCUMENTS

| | | | |
|---|---|---|---|
| 7,812,345 B2 | 10/2010 | Yoshida et al. | |
| 8,040,470 B2 | 10/2011 | Kashiwagi | |
| 8,378,361 B2 | 2/2013 | Takeuchi et al. | |
| 2003/0127657 A1 | 7/2003 | Park | |
| 2005/0196526 A1* | 9/2005 | Ishida | H01L 51/5278 427/66 |
| 2006/0060838 A1* | 3/2006 | Kang | H01L 27/3246 257/40 |
| 2007/0176563 A1* | 8/2007 | Kim | H01L 51/5246 315/169.3 |
| 2007/0182324 A1 | 8/2007 | Richardson et al. | |
| 2007/0222379 A1* | 9/2007 | Yamazaki | H01L 27/3209 313/509 |
| 2009/0209161 A1 | 8/2009 | Nellissen | |
| 2009/0231521 A1* | 9/2009 | Kashiwagi | G02B 5/201 349/106 |
| 2009/0284128 A1 | 11/2009 | Shinohara et al. | |
| 2011/0108880 A1 | 5/2011 | Yanagihara | |
| 2011/0127502 A1 | 6/2011 | Kim | |
| 2011/0198598 A1* | 8/2011 | Kim | H01L 27/3246 257/59 |
| 2011/0220879 A1 | 9/2011 | Im et al. | |
| 2012/0133275 A1 | 5/2012 | Lee et al. | |
| 2013/0059405 A1 | 3/2013 | Goda | |

FOREIGN PATENT DOCUMENTS

| | | |
|---|---|---|
| JP | 2007-242592 A | 9/2007 |
| JP | 2010-010670 A | 1/2010 |
| JP | 2011-71139 A | 4/2011 |
| JP | 2011-096376 A | 5/2011 |
| KR | 10-2003-0058151 | 7/2003 |
| KR | 10-2003-0070627 | 9/2003 |
| KR | 10-2005-0087115 | 8/2005 |
| KR | 10-2011-0060488 | 6/2011 |
| TW | 200539744 | 12/2005 |
| TW | 201214835 | 4/2012 |
| WO | 2009107323 A1 | 9/2009 |

OTHER PUBLICATIONS

Japanese OA dated Jan. 4, 2017 of Corresponding Japanese Patent App. No. 2013-121546 which also claims Korean Patent Application No. 10-2012-0108682 as its priority application, together with Request for Entry of the Accompanying Office Action attached herewith.

Chinese Office Action issued by SIPO dated Jun. 13, 2017 in corresponding Chinese Patent Application No. 201310282070.6 which also claims Korean Patent Application No. 10-2012-0108682 as its priority application, together with Request for Entry of the Accompanying Office Action attached herewith.

* cited by examiner

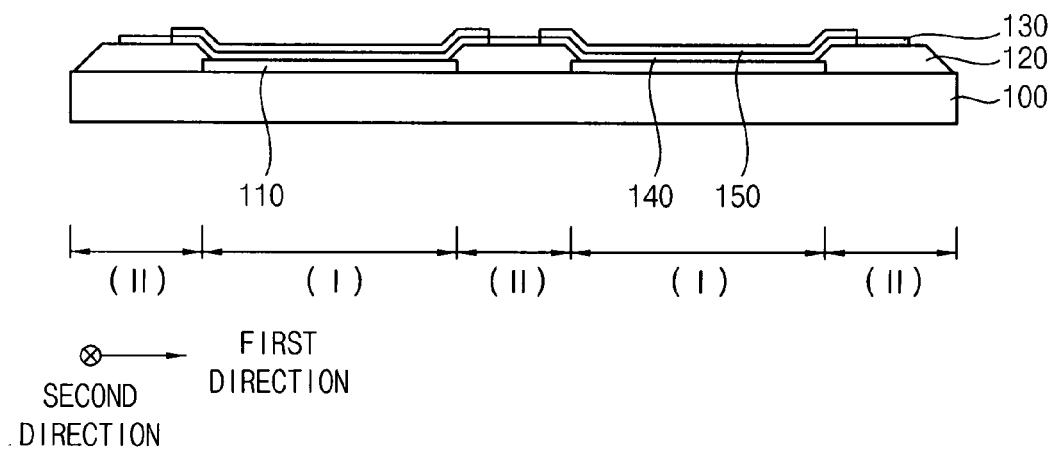
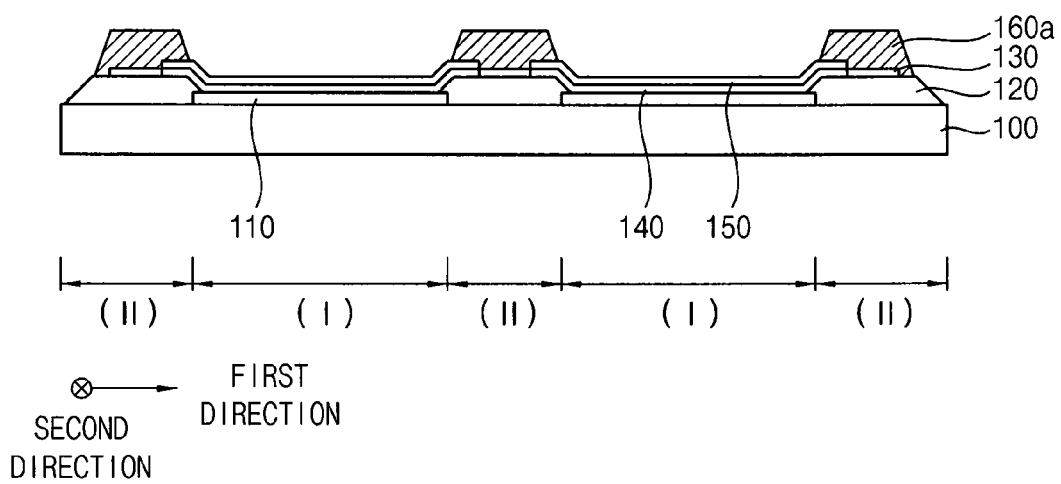

ORGANIC LIGHT EMITTING DISPLAY DEVICES AND METHODS OF MANUFACTURING ORGANIC LIGHT EMITTING DISPLAY DEVICES

CROSS-REFERENCE TO RELATED APPLICATIONS AND CLAIM OF PRIORITY

This application is a divisional application of the prior application Ser. No. 13/919,343 filed in the U.S. Patent & Trademark Office on Jun. 17, 2013 and assigned to the assignee of the present invention. Furthermore, this application claims priority under 35 USC §119 to Korean Patent Application No. 10-2012-0108682 filed on Sep. 28, 2012 in the Korean Intellectual Property Office (KIPO), the disclosures of which are herein incorporated by reference in their entireties.

BACKGROUND

Field

Example embodiments relate to organic light emitting display devices and methods of manufacturing organic light emitting devices. More particularly, example embodiments relate to organic light emitting display devices having improved optical characteristics and methods of manufacturing organic light emitting devices having improved optical characteristics.

Description of the Related Art

An organic light emitting display (OLED) device may display desired information such as images, letters and/or characters using a light generated by the combination of holes provided from an anode and electrons provided from a cathode in an organic layer thereof. The OLED device may have several advantages such as wide viewing angle, high response time, thin thickness and low power consumption, so that the OLED device may be widely employed in various electrical and electronic apparatuses. Recently, the OLED device has been rapidly developed as one of the most promising display devices.

For the conventional organic light emitting display device, a hole injection layer (HIL), a hole transfer layer (HTL), an electron injection layer (EIL) and/or an electron transfer layer (ETL) may be disposed to promote charge carrier (e.g. hole or electron) movement. These layers may have a relatively high conductivity to improve luminance efficiency. However, when these layers are coated on a substrate without a patterning process, a cross talk phenomenon may occur. That is, the charge carrier injected in a selected pixel may leak into adjacent undesired pixel through these layers.

SUMMARY

Example embodiments provide an organic light emitting display device which may prevent or reduce a cross talk between charge transport layers.

Example embodiments provide a method of manufacturing an organic light emitting display device which may prevent or reduce a cross talk between charge transport layers.

According to example embodiments, there is provided an organic light emitting display device including a substrate, a first electrode, a pixel defining layer, a first hydrophobic pattern, at least one charge transport layer, a second hydrophobic pattern, an organic light emitting layer and a second electrode. The substrate has a pixel region and a non pixel region surrounding the pixel region. The first electrode is disposed on the substrate in the pixel region. The pixel defining layer is disposed on the substrate in the non pixel region. The first hydrophobic pattern is disposed on the pixel defining layer. The at least one charge transport layer is disposed on the first electrode. The second hydrophobic pattern is disposed on the pixel defining layer to cover the first hydrophobic pattern. The organic light emitting layer is disposed on the at least one charge transport layer. The second electrode is disposed on the organic light emitting layer.

In example embodiments, each of the first hydrophobic pattern and the second hydrophobic pattern may have a surface energy below about 20 dyne/$cm^2$ In example embodiments, the first hydrophobic pattern may have an electric conductivity smaller than an electric conductivity of the at least one charge transport layer.

In example embodiments, the pixel defining layer may have a thickness of about 100 nm to about 400 nm.

In example embodiments, the at least one charge transport layer may include a hole transfer layer and a hole injection layer.

In example embodiments, the at least one charge transport layer may include an electron transfer layer and an electron injection layer.

In example embodiments, a portion of the charge transport layer may overlap with the pixel defining layer, and the second hydrophobic pattern may cover the portion of the charge transport layer.

In example embodiments, the first hydrophobic pattern and the second hydrophobic pattern may not overlap with the first electrode.

In example embodiments, the first hydrophobic pattern may have a thickness smaller than a thickness of the pixel defining layer, and the second hydrophobic pattern may have a thickness larger than the thickness of the pixel defining layer.

In example embodiments, the first hydrophobic pattern and the second hydrophobic pattern may extend in a first direction and a second direction substantially perpendicular to the first direction.

In example embodiments, the first hydrophobic pattern may extend in a first direction and a second direction substantially perpendicular to the first direction, and the second hydrophobic pattern may extend in the second direction.

According to example embodiments, there is provided a method of manufacturing an organic light emitting display device. In the method, a first electrode is formed on a substrate. A pixel defining layer is formed on the substrate adjacent to the first electrode. A first hydrophobic pattern is formed on the pixel defining layer. At least one charge transport layer is formed on the first electrode. A second hydrophobic pattern is formed on the pixel defining layer to cover the first hydrophobic pattern. An organic light emitting layer is formed on the at least one charge transport layer. A second electrode is formed on the organic light emitting layer and the second hydrophobic pattern.

In example embodiments, forming the first hydrophobic pattern may be performed by an offset printing process, a gravure offset printing process, a gravure reverse offset printing process, an inkjet printing process, a nozzle printing process, a T-jet process, a stamping process, an electro spray process or a laser induced thermal imaging process, and forming the second hydrophobic pattern may be performed by an offset printing process, a gravure offset printing process, a gravure reverse offset printing process, an inkjet printing process, a nozzle printing process, a T-jet process, a stamping process, an electro spray process or a laser induced thermal imaging process.

In example embodiments, forming the at least one charge transport layer may be performed by a slit coating process, a bar coating process or a spin coating process. The at least one charge transport layer may cover the first electrode completely, and the at least one charge transport layer may cover the pixel defining layer partially.

In example embodiments, the at least one charge transport layer may include a hole transfer layer and a hole injection layer.

In example embodiments, the at least one charge transport layer may include an electron transfer layer and an electron injection layer.

In example embodiments, the substrate may have a plurality of pixel regions and a non pixel region surrounding the plurality of pixel regions, and the plurality of pixel regions is arranged in a first direction and a second direction substantially perpendicular to the first direction. The first electrode may be formed in the pixel regions, and the pixel defining layer, the first hydrophobic pattern and the second hydrophobic pattern may be formed in the non pixel region.

In example embodiments, a portion of the charge transport layer may overlap with the pixel defining layer, and the second hydrophobic pattern may cover the portion of the charge transport layer.

In example embodiments, the first hydrophobic pattern and the second hydrophobic pattern may partially or completely cover the pixel defining layer.

According to some example embodiments, there is provided a method of manufacturing an organic light emitting display device. In the method, a first electrode is formed on a substrate. A pixel defining layer is formed on the substrate adjacent to the first electrode. A first hydrophobic pattern is formed on the pixel defining layer. At least one charge transport layer is formed on the first electrode. An organic light emitting layer is formed on the at least one charge transport layer. A second electrode is formed on the organic light emitting layer and the second hydrophobic pattern. The first hydrophobic pattern may have an electric conductivity lower than an electric conductivity of the at least one charge transport layer.

According to example embodiments, a first hydrophobic pattern having a relatively small electric conductivity may be disposed on a pixel defining layer, so that each of hole injection layers and each of hole transfer layers may be separated from each other. Therefore, a cross talk phenomenon may be prohibited or reduced. That is, a hole injected into the hole injection layer and the hole transfer layer in a selected pixel region (I) may not migrate to the hole injection layer and the hole transfer layer in an unselected pixel region (I). Further, the second hydrophobic pattern may have a relatively large thickness, so that a material of the each organic light emitting layer may not be mixed from each other.

BRIEF DESCRIPTION OF THE DRAWINGS

Example embodiments will be more clearly understood from the following detailed description taken in conjunction with the accompanying drawings. FIGS. 1 to 14 represent non-limiting, example embodiments as described herein.

FIG. 1 is a plan view illustrating an organic light emitting display device in accordance with example embodiments;

FIG. 2 is a cross-sectional view illustrating organic light emitting display devices in accordance with example embodiments;

FIG. 3 is a cross-sectional view illustrating organic light emitting display devices in accordance with some example embodiments;

FIGS. 4 to 11 are cross-sectional views illustrating a method of manufacturing an organic light emitting display device in accordance with example embodiments; and FIGS. 12 to 14 are cross-sectional views illustrating a method of manufacturing an organic light emitting display device in accordance with some example embodiments.

DESCRIPTION OF EMBODIMENTS

Figure 1:
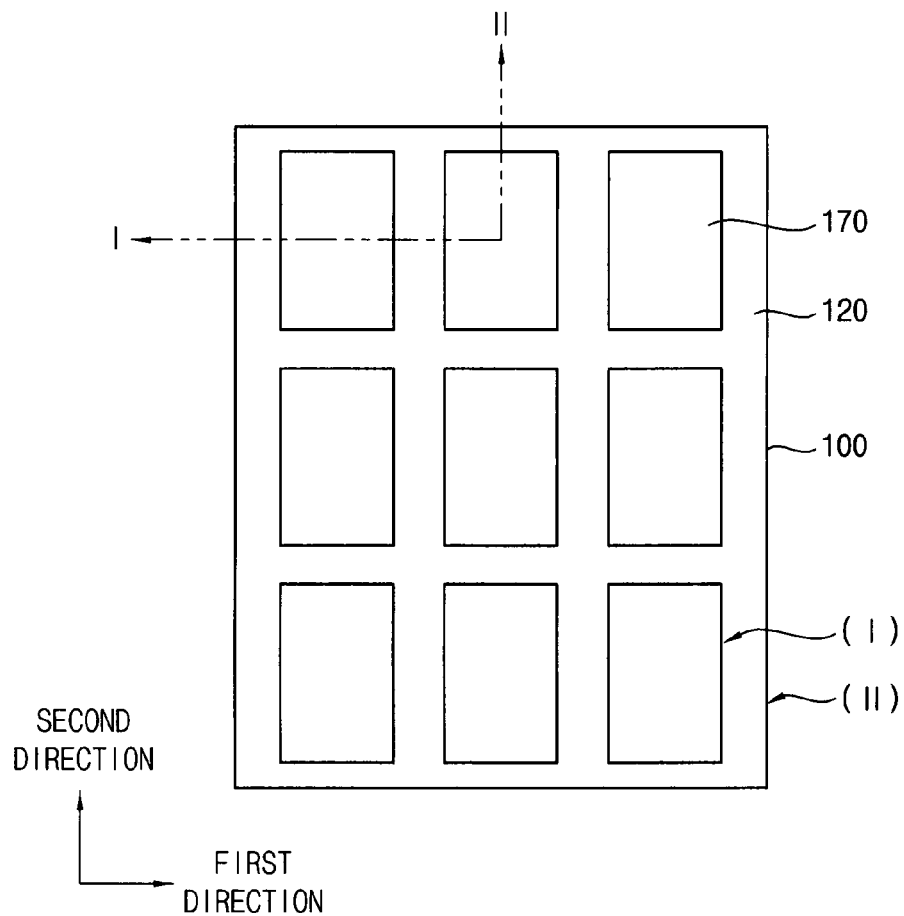

Various example embodiments will be described more fully hereinafter with reference to the accompanying drawings, in which some example embodiments are shown. The invention may, however, be embodied in many different forms and should not be construed as limited to the example embodiments set forth herein. Rather, these example embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
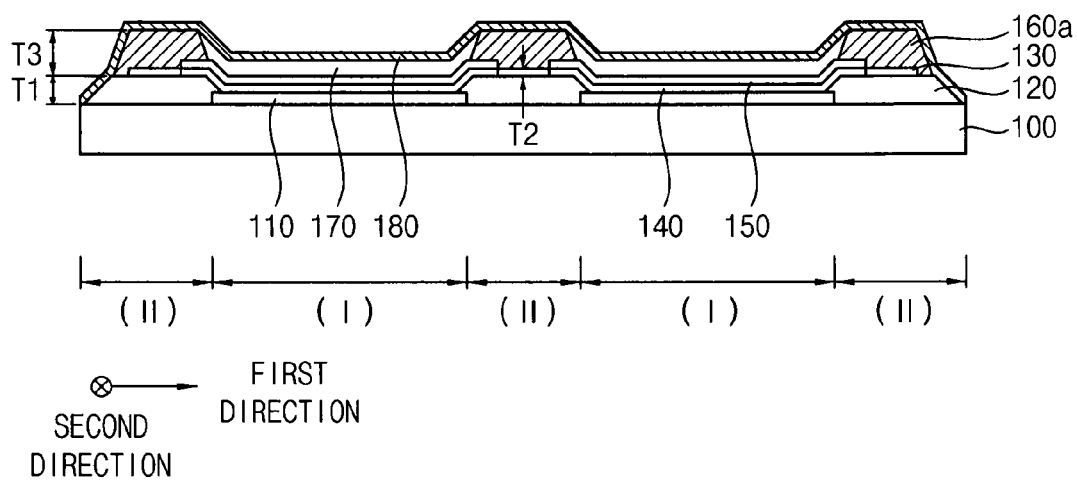

FIG. 1 is a plan view illustrating an organic light emitting display device in accordance with example embodiments, and FIG. 2 is a cross-sectional view cut along line I-II of FIG. 1.

Referring to FIGS. 1 and 2, the organic light emitting display (OLED) device may include a substrate 100, a first electrode 110, a pixel defining layer 120, a first hydrophobic pattern 130, at least one charge transport layer, a second hydrophobic pattern 160a, an organic light emitting layer 170 and a second electrode 180. In example embodiments, the at least one charge transport layer may include a hole injection layer (HIL) 140 and/or a hole transfer layer (HTL) 150

The substrate 100 may include a transparent substrate such as a glass substrate, a quartz substrate, a transparent plastic substrate, etc. For example, the transparent plastic substrate may include polyimide, acryl-based resin, polyethylene terephthalate (PET), polycarbonate, polyacrylate, polyether, etc.

The substrate 100 may include a plurality of pixel regions (I) and a non pixel region (II). The plurality of pixel regions (I) may be arranged in a first direction and a second direction substantially perpendicular to the first direction, and the non pixel region (II) may surround the plurality of pixel regions (I). The plurality of pixel regions (I) may correspond to regions for generating a light from the organic light emitting layer 170, and the non pixel region (II) may separate the plurality of pixel regions (I) from each other.

The first electrode 110 may be disposed on the substrate 100 in the pixel region (I). The first electrode 110 may be a reflective electrode or a transmissive electrode depending on an emission type of the OLED device. In example embodiments, when the first electrode 110 is the transmissive electrode, the first electrode 110 may include indium tin oxide (ITO), indium zinc oxide (IZO), zinc tin oxide (ZTO), gallium tin oxide (GTO), zinc oxide (ZnOx), indium oxide (InOx), tin oxide (SnOx), gallium oxide (GaOx), mixtures thereof. In some example embodiments, when the first electrode 110 is the reflective electrode, the first electrode 110 may include aluminum (Al), tungsten (W), copper (Cu), nickel (Ni), chromium (Cr), molybdenum (Mo), titanium (Ti), platinum (Pt), silver (Ag), tantalum (Ta), ruthenium (Ru), alloys thereof.

When the OLED device has an active matrix type, a switching structure (not illustrated) may be disposed between the substrate 100 and the first electrode 110. The switching structure may include a switching device (not illustrated) and at least one of insulation layers (not illustrated). In example embodiments, the switching device may include a thin film transistor having a semiconductor layer containing silicon. In some example embodiments, the switching device may include an oxide semiconductor device having an active layer containing semiconductor oxide. In this case, the first electrode 110 may be electrically connected to the switching device.

The pixel defining layer 120 may be disposed on the substrate in the non pixel region (II). In example embodiments, the pixel defining layer 120 may be disposed adjacent to the first electrode 110, and a portion of the pixel defining layer 120 may overlap with the first electrode 110. Alternatively, the pixel defining layer 120 may not overlap with the first electrode 110. In example embodiments, the pixel defining layer 120 on the substrate 100 may extend in the first direction and the second direction as illustrated in FIG. 1. For example, the pixel defining layer 120 may have a first thickness (T1) of about 100 nm to about 400 nm.

A sidewall of the pixel defining layer 120 may have a predetermined angle with respect to an upper surface of the substrate 100. For example, the sidewall of the pixel defining layer 120 may have the angle below about 45 degrees with respect to the upper surface of the substrate 100. That is, the pixel defining layer 120 may have a relatively gradual slope.

The first hydrophobic pattern 130 may be disposed on the pixel defining layer 120 in the non pixel region (II). The first hydrophobic pattern 130 may extend in the first direction and the second direction. In this case, the first hydrophobic pattern 130 may not overlap with the first electrode 110. In example embodiments, the first hydrophobic pattern 130 may partially cover the pixel defining layer 120. Alternatively, the first hydrophobic pattern 130 may cover the pixel defining layer 120 sufficiently or completely.

In example embodiments, the first hydrophobic pattern 130 may include a material which has a relatively small electric conductivity, and a hydrophobic characteristic, that is having a relatively small surface energy. For example, the first hydrophobic pattern 130 may have a second thickness (T2) of about 30 nm to about 100 nm. That is, the second thickness (T2) of the first hydrophobic pattern 130 may be smaller than the first thickness (T1) of the pixel defining layer 120.

The hole injection layer (HIL) 140 may be disposed on the first electrode 110 and the pixel defining layer 120. The hole injection layer 140 may promote a hole injection from the first electrode 110 into the organic light emitting layer 170. For example, the hole injection layer 140 may include CuPc(cupper phthalocyanine), PEDOT(poly(3,4)-ethylenedioxythiophene), PANI(polyaniline), NPD(N,N-dinaphthyl-N,N'-diphenyl benzidine), etc., however, a material in the hole injection layer 140 may not be limited thereto. In example embodiment, a plurality of hole injection layers 140 may be arranged in the first direction and the second direction depending on the arrangement of the pixel regions (I).

The hole transfer layer (HTL) 150 may be located on the hole injection layer 140. The hole transfer layer 150 may improve a hole movement from the hole injection layer 140. For example, the hole transfer layer 150 may include NPD (N,N-dinaphthyl-N,N'-diphenylbenzidine), TPD(N,N'-bis-(3-methylphenyl)-N,N'-bis-(phenyl)-benzidine), s-TAD, MTDATA (4,4',4"-Tris(N-3-methylphenyl-N-phenyl-amino)-triphenylamine), etc., however, a material in the hole transfer layer 150 may not be limited thereto. In example embodiment, a plurality of hole transfer layers 150 may be arranged in the first direction and the second direction depending on the arrangement of the pixel regions (I).

In example embodiments, the hole injection layer 140 and the hole transfer layer 150 may be disposed not to overlap with the first hydrophobic pattern 130 having a relatively small surface energy. Therefore, each of the hole injection layers 140 and each of the hole transfer layers 150 may be electrically separated from each other.

The second hydrophobic pattern 160b may be disposed on the pixel defining layer 120, the first hydrophobic pattern 130 and/or the hole transfer layer 150 in the non pixel region (II). The second hydrophobic pattern 160a may not overlap with the first electrode 110. In example embodiments, the second hydrophobic pattern 160a may partially cover the pixel defining layer 120. In some example embodiments, the second hydrophobic pattern 160 may cover the pixel defining layer 120 sufficiently or completely.

Figure 9A:
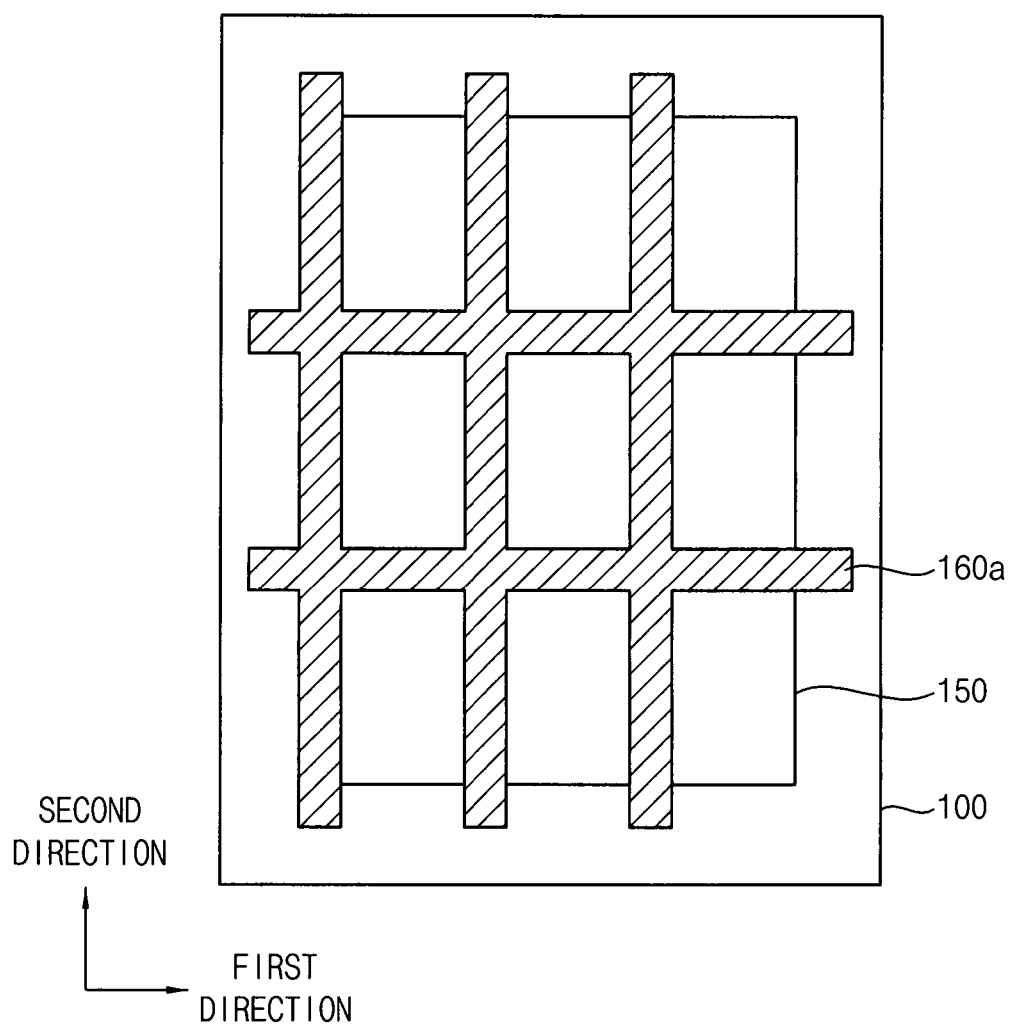
Figure 9B:
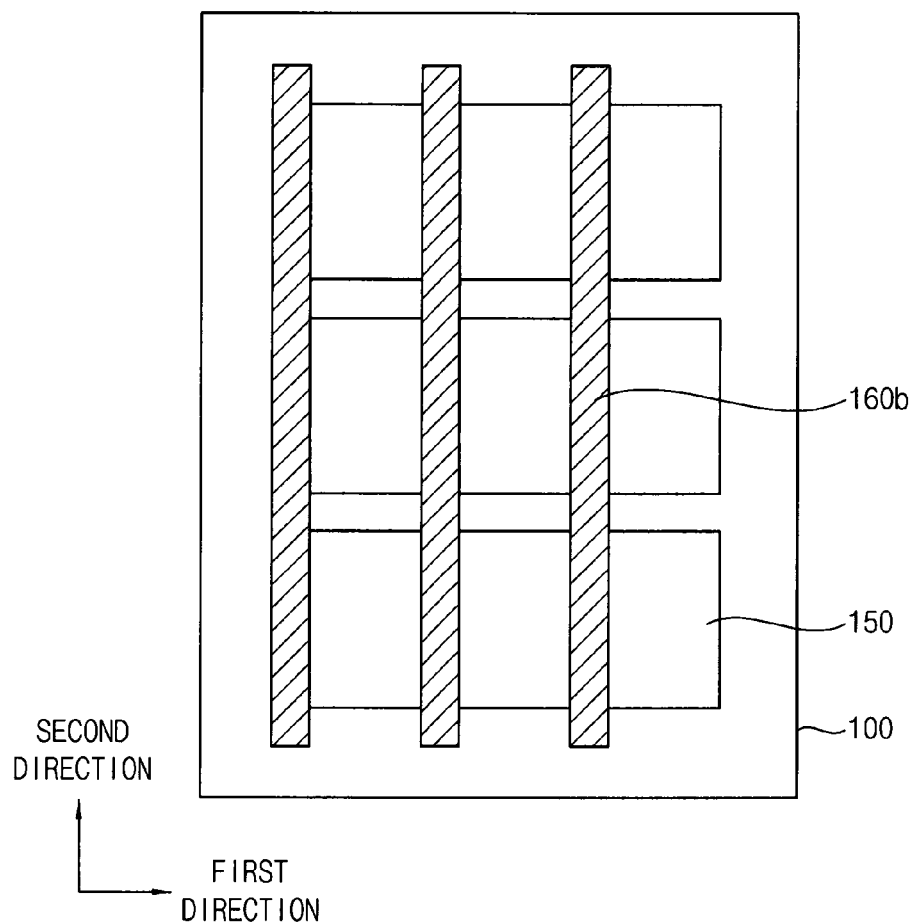

In example embodiments, the second hydrophobic pattern 160a may extend in the first direction and the second direction to form a lattice structure as illustrated in FIG. 9A. In some example embodiments, the second hydrophobic pattern 160b may extend in the second direction as illustrated in FIG. 9B.

The second hydrophobic pattern 160a may include a hydrophobic material having a surface energy below about 20 dyne/cm$^2$. Also, the second hydrophobic pattern 160a may have a third thickness (T3) of about 500 nm to about 3 µm. That is, the third thickness (T3) of the second hydrophobic pattern 160a may be larger than the first thickness (T1) of the pixel defining layer 120.

The organic light emitting layer 170 may be disposed on an upper surface of the hole transfer layer 150, an upper surface of the pixel defining layer 120, a sidewall of the second hydrophobic pattern 160a. A portion of the organic light emitting layer 170 on the side wall of the second hydrophobic pattern 160a may have a substantially uneven thickness. Whereas, the first hydrophobic pattern 130 and the second hydrophobic pattern 160a may be disposed not to overlap with the first electrode 110 in the pixel region (I), so that a portion of the organic light emitting layer 170 on the hole transfer layer 150 in the pixel region (I) may have a substantially even thickness. That is, the organic light emitting layer 170 may have a substantially even thickness in the pixel region (I), so that the organic light emitting layer 170 may generate a light having a substantially even intensity in the pixel region (I).

The organic light emitting layer 170 may include an organic material or a mixture of an organic material and an inorganic material generating at least one of a red color of light, a green color of light, and a blue color of light. In some example embodiments, the organic light emitting layer 170 include a stacked structure including light emitting layers for the red color of light, the green color of light, and the blue color of light to generate a white color of light.

The second electrode 180 may cover the organic light emitting layer 170 and the second hydrophobic pattern 160a in the pixel region (I) and the non pixel region (II). The second electrode 180 may be a reflective electrode or a transmissive electrode depending on the type of the first electrode 110. When the first electrode 110 is the transmissive electrode, the second electrode 180 may be the reflective electrode. In this case, the second electrode 180 may include Al, W, Cu, Ni, Cr, Mo, Ti, Pt, Ag, Ta, Ru, alloys thereof. Alternatively, when the first electrode 110 is the reflective electrode, the second electrode 180 may be the transmissive electrode, and may include ITO, IZO, ZTO, GTO, ZnOx, InOx, SnOx, GaOx or mixtures thereof.

In example embodiments, the first electrode 110 may serve as an anode, and the hole injection layer 140 and the hole transfer layer 150 may be disposed between the first electrode 110 and the organic light emitting layer 170 as illustrated in FIG. 2. However, the inventive concept may not be limited to the above-described construction. In some example embodiments, the first electrode 110 may serve as a cathode. In this case, an electron transfer layer and an electron injection layer may be disposed between the first electrode 110 and the organic light emitting layer 170.

According to example embodiments, the first hydrophobic pattern 130 having a relatively small electric conductivity may be disposed on the pixel defining layer 120, so that each of the hole injection layers 140 and each of the hole transfer layers 150 may be separated from each other. Therefore, a cross talk phenomenon may be prohibited or reduced. That is, a hole injected into the hole injection layer 140 and the hole transfer layer 150 in a selected pixel region (I) may not migrate to the hole injection layer 140 and the hole transfer layer 150 in an unselected pixel region (I). Further, the second hydrophobic pattern 160a may have a relatively large thickness, so that a material of the each organic light emitting layer 170 may not be mixed from each other.

Figure 3:
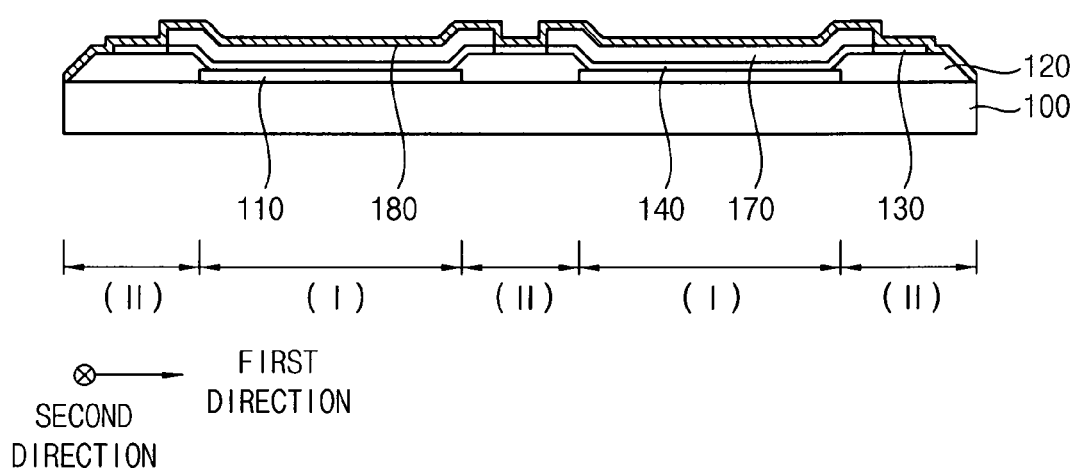

FIG. 3 is a cross-sectional view illustrating organic light emitting display devices in accordance with some example embodiments.

Referring to FIG. 3, the OLED device may include a substrate 100, a first electrode 110, a pixel defining layer 120, a first hydrophobic pattern 130, a hole injection layer 140, an organic light emitting layer 170 and a second electrode 180. The OLED device illustrated in FIG. 3 may have a construction substantially the same as or substantially similar to that of the OLED device described with reference to FIGS. 1 and 2 except for a hole transfer layer 150 and a second hydrophobic pattern 160a.

The first electrode 110 may be disposed on the substrate 100 in the pixel region (I), and the pixel defining layer 120 may be disposed on the substrate 100 in the non pixel region (II).

The first hydrophobic pattern 130 may be disposed to cover the pixel defining layer 120 partially or completely. The first hydrophobic pattern 130 may include a material having a relatively small electric conductivity and a hydrophobic characteristic. Also, the first hydrophobic pattern 130 may have a thickness of about 30 nm to about 100 nm.

The hole injection layer 140 may be disposed on the first electrode 110 and the pixel defining layer 120, and the organic light emitting layer 170 may be disposed on the hole injection layer 140. A hole transfer layer (not illustrated)

may be further disposed between the hole injection layer and the organic light emitting layer 170. The hole injection layer 140 and the organic light emitting layer 170 may include material substantially the same as or substantially similar to those of the hole injection layer 140 and the organic light emitting layer 170 described with reference to FIG. 2.

The second electrode 180 may cover the organic light emitting layer 170 and the first hydrophobic pattern 130 in the pixel region (I) and the non pixel region (II).

According to example embodiments, the first hydrophobic pattern 130 having a relatively small electric conductivity may be disposed on the pixel defining layer 120, so that each of the hole injection layers 140 may be separated from each other. Therefore, a cross talk phenomenon may be prohibited or reduced. That is, a hole injected into the hole injection layer 140 in a selected pixel region (I) may not migrate to the hole injection layer 140 and in an unselected pixel region (I).

FIGS. 4 to 11 are cross-sectional views illustrating a method of manufacturing an organic light emitting display device in accordance with example embodiments. FIGS. 9a and 9b are cross-sectional views illustrating a method of manufacturing an organic light emitting display device in accordance with different example embodiments.

Figure 4:
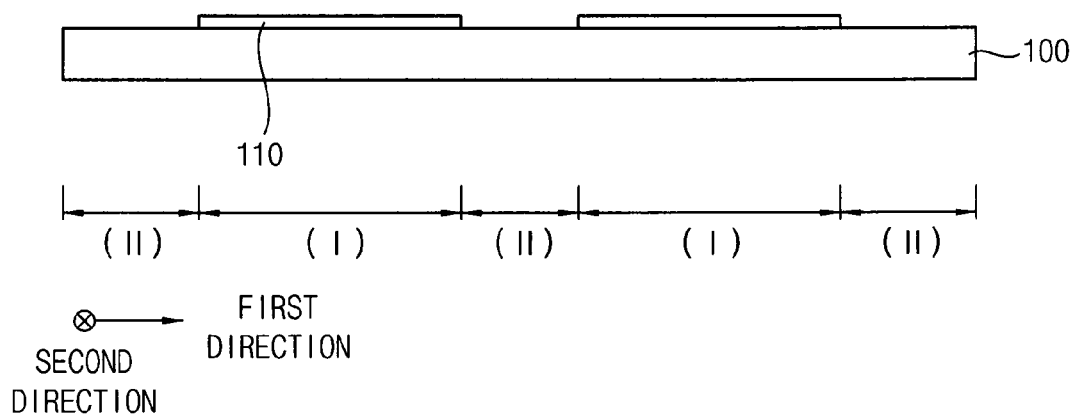

Referring to FIG. 4, a first electrode 110 may be formed on a substrate 100

In example embodiments, the substrate 100 may include a transparent substrate such as a glass substrate, a quartz substrate, a transparent plastic substrate, etc. Further, the substrate 100 may include a flexible substrate. The substrate 100 may include a plurality of pixel regions (I) and a non pixel region (II). The plurality of pixel regions (I) may be arranged in a first direction and a second direction substantially perpendicular to the first direction, and the non pixel region (II) may surround the plurality of pixel regions (I).

The first electrode 110 may be formed on the substrate 100 in the pixel region (I). After forming a conductive layer on the substrate, the conductive layer may be patterned to form the first electrode 110. Therefore, a plurality of first electrodes 110 may be formed to correspond to the plurality of pixel regions (I).

The first electrode 110 may be a reflective electrode or a transmissive electrode depending on an emission type of the OLED device. When the OLED device has a bottom emission type, the conductive layer may be formed using ITO, IZO, ZTO, GTO, ZnOx, InOx, SnOx, GaOx, mixtures thereof. When the OLED device has a top emission type, the conductive layer may be formed using Al, W, Cu, Ni, Cr, Mo, Ti, Pt, Ag, Ta, Ru, alloys thereof.

When the OLED device has an active matrix type, the switching structure (not illustrated) may be formed between the substrate 100 and the first electrode 110. The switching structure may be electrically connected to the first electrode 110.

Figure 5:
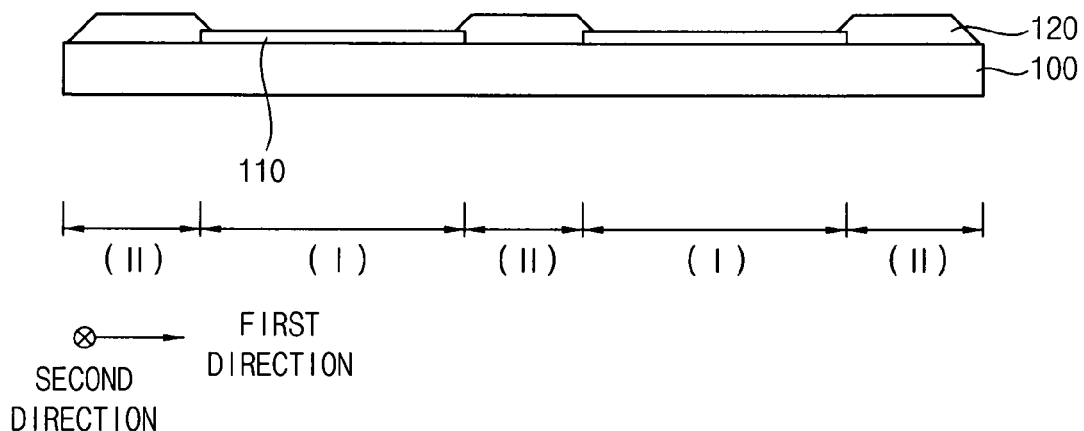

Referring to FIG. 5, a pixel defining layer 120 may be formed on the substrate 100. The pixel defining layer 120 may be formed to correspond to the non pixel region (II) of the substrate 100. In this case, the pixel defining layer 120 may be formed adjacent to the first electrode 110, and a portion of the pixel defining layer 120 may overlap with the first electrode 110. In example embodiments, the pixel defining layer 120 may expand in the first direction and the second direction. For example, the pixel defining layer 120 may have a relatively small thickness of about 100 nm to about 400 nm.

A sidewall of the pixel defining layer 120 may have a predetermined angle with respect to an upper surface of the substrate 100. For example, the sidewall of the pixel defining layer 120 may have an angle below about 45 degrees with respect to the upper surface of the substrate 100. That is, the pixel defining layer 120 may have a relatively gradual slope.

Figure 6:
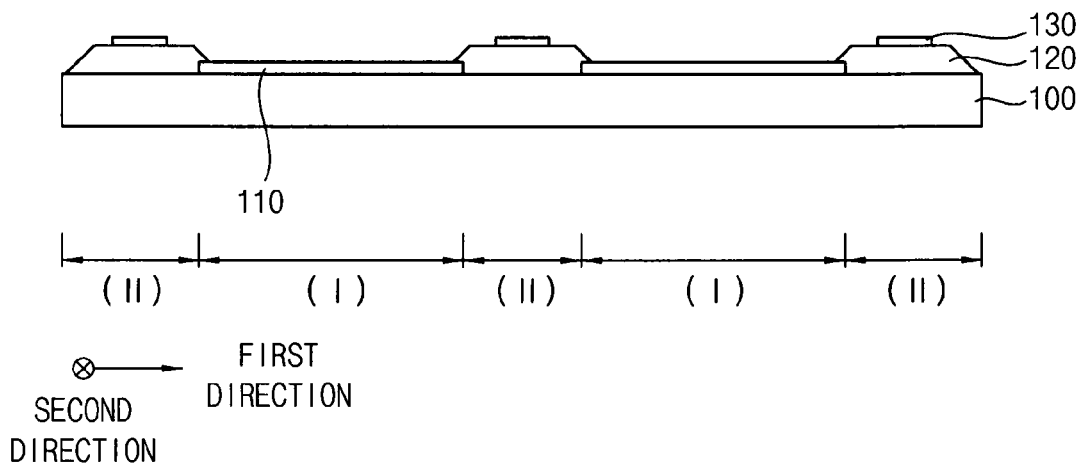

Referring to FIG. 6, a first hydrophobic pattern 130 may be formed on the pixel defining layer 120. The first hydrophobic pattern 130 may be formed by an offset printing process, a gravure offset printing process, a gravure reverse offset printing process, an inkjet printing process, a nozzle printing process, a T-jet process, a stamping process, an electro spray process or a laser induced thermal imaging process.

The first hydrophobic pattern 130 may be formed using a material having a relatively small electric conductivity and having a hydrophobic characteristic. For example, the first hydrophobic pattern 130 may have an electric conductivity smaller than that of the charge transport layers which may be formed on the first electrode 110. Also, the first hydrophobic pattern 130 may have a surface energy below about 20 dyne/cm$^2$, and may have a thickness of about 30 nm to about 100 nm.

In example embodiments, the first hydrophobic pattern 130 may partially cover the pixel defining layer 120, or completely cover the pixel defining layer 120. In this case, the first hydrophobic pattern 130 may not overlap with the first electrode 110.

Referring to FIG. 7, at least one charge transport layer may be formed on the first electrode 110. In example embodiments, the charge transport layer may include a hole injection layer 140 and/or a hole transfer layer 150. The hole injection layer 140 may be formed on the first electrode 110 and the pixel defining layer 120 by a slit coating process, a bar coating process or a spin coating process. On the other hand, the hole transfer layer 150 may be formed on the hole injection layer 140 by a slit coating process, a bar coating process or a spin coating process.

In example embodiments, during the coating process for forming the hole injection layer 140 and the hole transfer layer 150, a coating solution may be sufficiently coated on the substrate 100 having the first electrode 110 and the pixel defining layer 120. The pixel defining layer 120 may have a relatively small thickness below about 400 nm, and the sidewall of the pixel defining layer 120 may have an angle below about 45 degrees with respect to the upper surface of the substrate 100, so that the coating solution may be coated on the first electrode 110 and the pixel defining layer 120 conformally. However, the coating solution may not be coated on the first hydrophobic pattern 130 having a relatively small surface energy. Therefore, the hole injection layer 140 and the hole transfer layer 150 may be formed to correspond to the plurality of pixel regions (I) without a patterning process. Further, the first hydrophobic pattern 130 may have an electrical conductivity smaller than those of the hole injection layer 140 and the hole transfer layer 150, so that a cross talk phenomenon may be prohibited or reduced. That is, a hole injected into the hole injection layer 140 and the hole transfer layer 150 in a selected pixel region (I) may not migrate to the hole injection layer 140 and the hole transfer layer 150 in an unselected pixel region (I).

Referring to FIG. 8, a second hydrophobic pattern 160a may be formed on the pixel defining layer 120 to cover the first hydrophobic pattern 130. The second hydrophobic pattern 160a may be formed by a process substantially the same or substantially similar to the process for forming the first hydrophobic pattern 130.

In example embodiments, the second hydrophobic pattern 160a may be formed using a hydrophobic material having a surface energy below about 20 dyne/cm$^2$. For example, the second hydrophobic pattern 160a may have a thickness of about 500 nm to about 3 μm.

In example embodiments, the second hydrophobic pattern 160a may partially or completely cover the pixel defining layer 120. The second hydrophobic pattern 160a may not overlap with the first electrode 110.

In example embodiments, the second hydrophobic pattern 160a may extend in the first direction and the second direction to form a lattice structure as illustrated in FIG. 9a. In other example embodiments, the second hydrophobic pattern 160b may extend in the second direction as illustrated in FIG. 9b.

Figure 10:
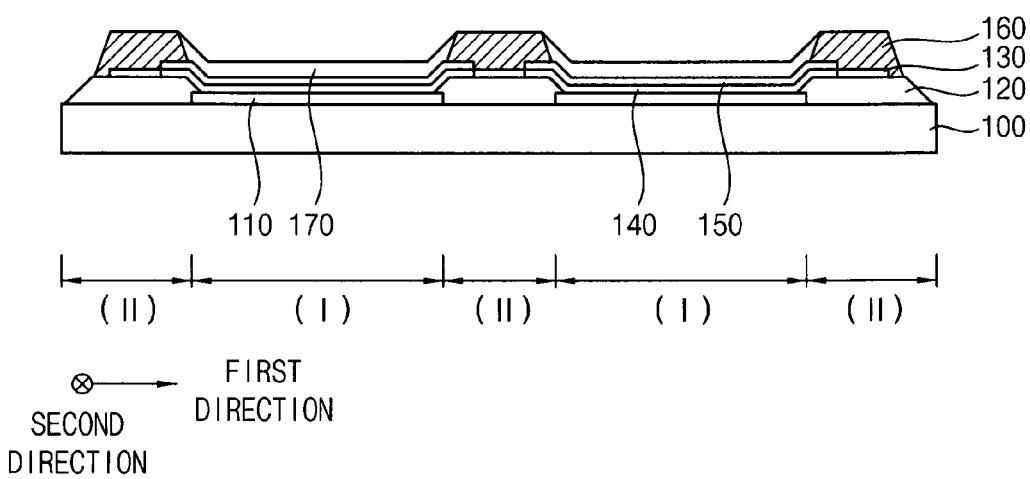

Referring to FIG. 10, an organic light emitting layer 170 may be formed on the hole transfer layer 150.

The organic light emitting layer 170 may be formed on an upper surface of the hole transfer layer 150 and a side wall of the second hydrophobic pattern 160a by a liquid phase patterning process. For example, the liquid phase patterning process may include an inkjet printing process, a nozzle printing process, a T-jet process, a stamping process or an electro spray process. A portion of the organic light emitting layer 170 on the side wall of the second hydrophobic pattern 160a may have a substantially uneven thickness. Whereas, the first hydrophobic pattern 130 and the second hydrophobic pattern 160a may be disposed not to overlap with the first electrode 110 in the pixel region (I), so that a portion of the organic light emitting layer 170 on the hole transfer layer 150 in the pixel region (I) may have a substantially even thickness. That is, the organic light emitting layer 170 may have a substantially even thickness in the pixel region (I), so that the organic light emitting layer 170 may generate a light having a substantially even intensity in the pixel region (I).

The organic light emitting layer 170 may include an organic material or a mixture of an organic material and an inorganic material generating at least one of a red color of light, a green color of light, and a blue color of light. In some example embodiments, the organic light emitting layer 170 include a stacked structure including light emitting layers for the red color of light, the green color of light, and the blue color of light to generate a white color of light.

In example embodiments, each of the pixel regions (I) may be separated by the second hydrophobic pattern 160a having a relatively large thickness, so that one organic material for one pixel region (I) may not be mixed with other organic material for other pixel region (I) during the liquid phase patterning process.

In other example embodiments, when the OLED device has a pixel arrangement of traditional RGB type, that is pixel regions of the same color are arranged in the second direction, the second hydrophobic pattern 160b expending in the second direction may prevent or reduce the mixture of the organic material.

Figure 11:
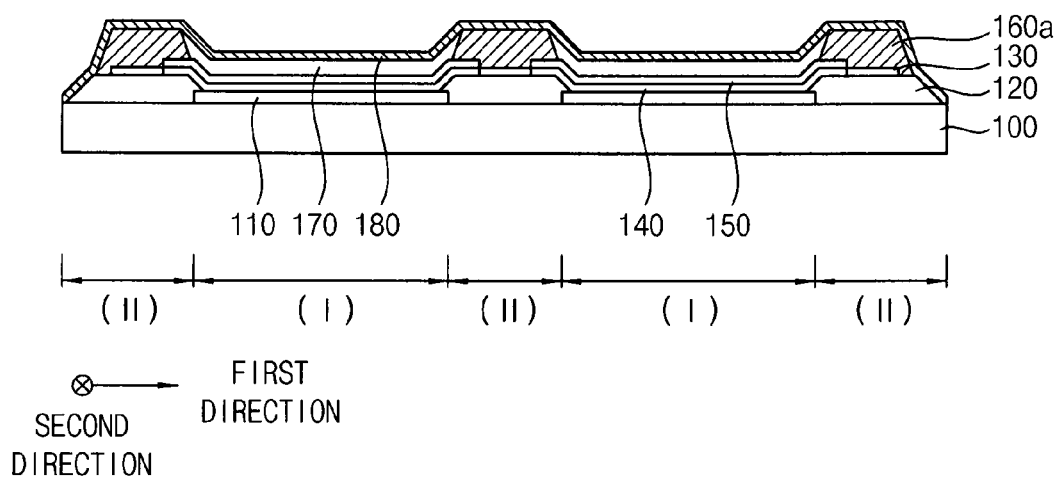

Referring to FIG. 11, the second electrode 180 may be formed on the organic light emitting layer 170 and the second hydrophobic pattern 160a in the pixel region (I) and the non pixel region (II).

The second electrode 180 may be a reflective electrode or a transmissive electrode depending on the type of the first electrode 110. When the first electrode 110 is the transmissive electrode, the second electrode 180 may be the reflective electrode. In this case, the second electrode 180 may be formed using Al, W, Cu, Ni, Cr, Mo, Ti, Pt, Ag, Ta, Ru or alloys thereof. Alternatively, when the first electrode 110 is the reflective electrode, the second electrode 180 may be the transmissive electrode, and may be formed using ITO, IZO, ZTO, GTO, ZnOx, InOx, SnOx, GaOx, mixtures thereof In example embodiments, the first electrode 110 may serve as an anode, and the hole injection layer 140 and the hole transfer layer 150 may be disposed between the first electrode 110 and the organic light emitting layer 170. However, the inventive concept may not be limited to the above-described construction. In some example embodiments, the first electrode 110 may serve as a cathode. In this case, an electron transfer layer and an electron injection layer may be disposed between the first electrode 110 and the organic light emitting layer 170.

According to example embodiments, the first hydrophobic pattern 130 having a relatively small electric conductivity may be disposed on the pixel defining layer 120, so that each of the hole injection layers 140 and each of the hole transfer layers 150 may be separated from each other. Therefore, a cross talk phenomenon may be prohibited. That is, a hole injected into the hole injection layer 140 and the hole transfer layer 150 in the selected pixel region (I) may not migrate to the hole injection layer 140 and the hole transfer layer 150 in the unselected pixel region (I). Further, the second hydrophobic pattern 160a may have a relatively large thickness, so that a material of the each organic light emitting layer 170 may not be mixed from each other.

Figure 12:
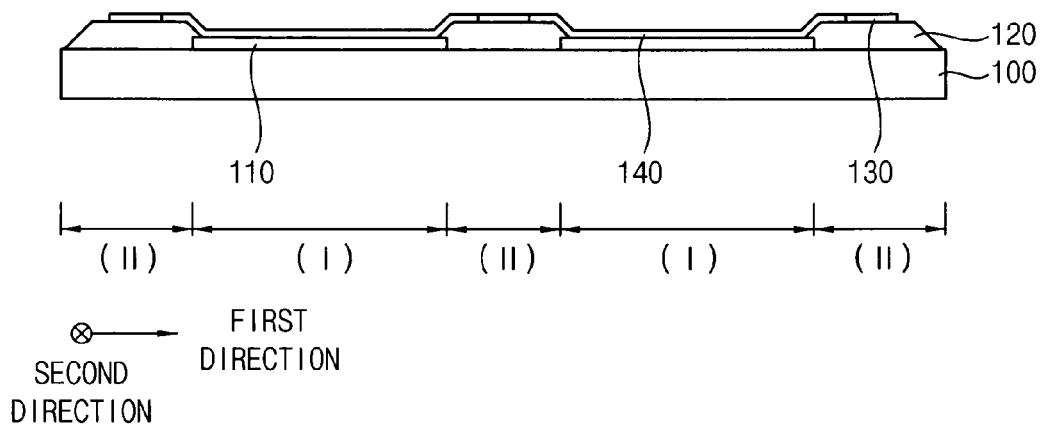
Figure 13:
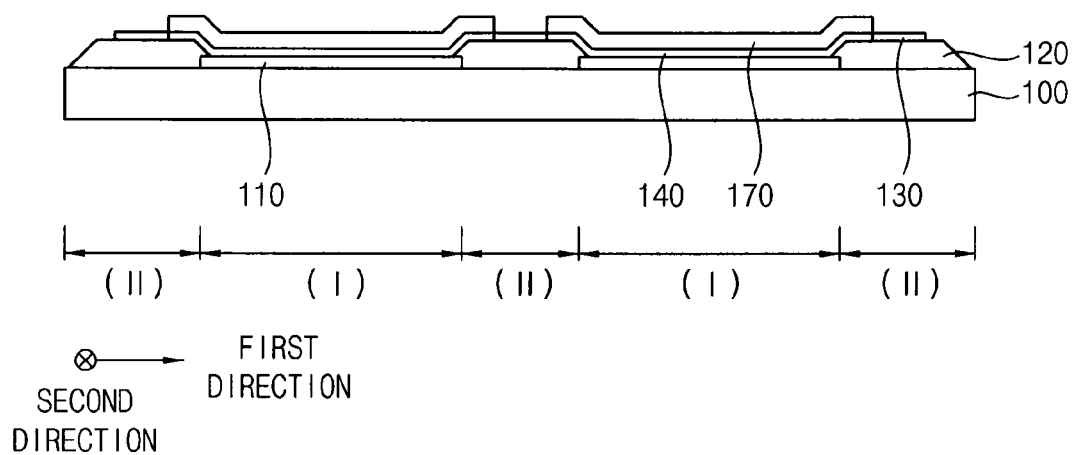
Figure 14:
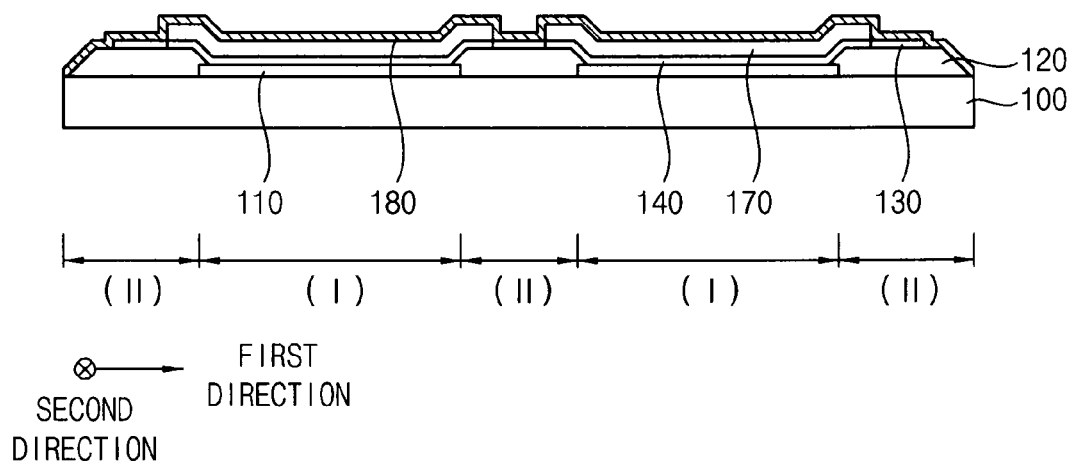

FIGS. 12 to 14 are cross-sectional views illustrating a method of manufacturing an organic light emitting display device in accordance with some example embodiments.

Referring to FIG. 12, a first electrode 110, a pixel defining layer 120, a first hydrophobic pattern 130 and a hole injection layer 140 may be formed on a substrate 100. Processes for forming the first electrode 110, the pixel defining layer 120, the first hydrophobic pattern 130 and the hole injection layer 140 may be substantially the same as or substantially similar to those for forming the first electrode 110, the pixel defining layer 120, the first hydrophobic pattern 130 and the hole injection layer 140 described with reference to FIGS. 4 to 6.

The hole injection layer 140 may be formed on the first electrode 110 and the pixel defining layer 120 by a slit coating process, a bar coating process or a spin coating process. In this case, the hole injection layer 140 may not be formed on the first hydrophobic pattern 130 having a relatively small surface energy. Further, the first hydrophobic pattern 130 may have an electrical conductivity smaller than that of the hole injection layer 140, so that a cross talk phenomenon may be prohibited. That is, a hole injected into the hole injection layer 140 in the selected pixel region (I) may not migrate to the hole injection layer 140 in the unselected pixel region (I).

Referring to FIG. 13, an organic light emitting layer 170 may be formed on the hole injection layer 140.

The organic light emitting layer 170 may be formed on an upper surface of the hole injection layer 140 by an inkjet printing process, a nozzle printing process, a T-jet process, a stamping process or an electro spray process.

The organic light emitting layer 170 may be disposed not to overlap with the first hydrophobic pattern 130, so that a portion of the organic light emitting layer 170 on the hole transfer layer 150 in the pixel region (I) may have a substantially even thickness. That is, the organic light emitting layer 170 may have a substantially even thickness in the pixel region (I), so that the organic light emitting layer 170 may generate a light having a substantially even intensity in the pixel region (I).

In example embodiments, each of the pixel regions (I) may be separated by the first hydrophobic pattern 130, so that one organic light emitting layer 170 for one pixel region (I) may not be mixed with other organic light emitting layer 170 for other pixel region (I).

Referring to FIG. 14, the second electrode 180 may be formed on the organic light emitting layer 170 and the first hydrophobic pattern 130 in the pixel region (I) and the non pixel region (II). The second electrode 180 may completely cover the pixel region (I) and the non pixel region (II). The second electrode 180 may be formed by a process substantially the same or substantially similar to the process described with reference to FIG. 11.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed:

1. An organic light emitting display device, comprising:
   a substrate having a pixel region and a non pixel region surrounding the pixel region;
   a first electrode disposed on the substrate in the pixel region;
   a pixel defining layer disposed on the substrate in the non pixel region;
   a first hydrophobic pattern disposed on the pixel defining layer, the first hydrophobic pattern being spaced apart from the first electrode;
   at least one charge transport layer disposed on the first electrode;
   a second hydrophobic pattern disposed on the pixel defining layer to cover the first hydrophobic pattern, the second hydrophobic pattern contacting said at least one charge transport layer, said at least one charge transport layer not disposed between the first hydrophobic pattern and the second hydrophobic pattern;
   an organic light emitting layer disposed on the at least one charge transport layer; and
   a second electrode disposed on the organic light emitting layer, wherein a portion of the at least one charge transport layer overlaps the pixel defining layer, and the second hydrophobic pattern covers the portion of the at least one charge transport layer.

2. The organic light emitting display device of claim 1, wherein each of the first hydrophobic pattern and the second hydrophobic pattern has a surface energy below about 20 $dyne/cm^2$.

3. The organic light emitting display device of claim 1, wherein the first hydrophobic pattern has an electric conductivity smaller than an electric conductivity of the at least one charge transport layer.

4. The organic light emitting display device of claim 1, wherein the pixel defining layer has a thickness of about 100 nm to about 400 nm.

5. The organic light emitting display device of claim 1, wherein the at least one charge transport layer includes a hole transfer layer and a hole injection layer.

6. The organic light emitting display device of claim 1, wherein the at least one charge transport layer includes an electron transfer layer and an electron injection layer.

7. The organic light emitting display device of claim 1, wherein the first hydrophobic pattern and the second hydrophobic pattern do not overlap with the first electrode.

8. The organic light emitting display device of claim 1, wherein the first hydrophobic pattern has a thickness smaller than a thickness of the pixel defining layer, and the second hydrophobic pattern has a thickness larger than the thickness of the pixel defining layer.

9. The organic light emitting display device of claim 8, wherein the first hydrophobic pattern and the second hydrophobic pattern extend in a first direction and a second direction substantially perpendicular to the first direction.

10. The organic light emitting display device of claim 8, wherein the first hydrophobic pattern extends in a first direction and a second direction substantially perpendicular to the first direction, and the second hydrophobic pattern extends in the second direction.

* * * * *